United States Patent
Naffziger et al.

(10) Patent No.: US 6,243,287 B1
(45) Date of Patent: Jun. 5, 2001

(54) DISTRIBUTED DECODE SYSTEM AND METHOD FOR IMPROVING STATIC RANDOM ACCESS MEMORY (SRAM) DENSITY

(75) Inventors: Samuel D Naffziger; Donald R Weiss; John Wuu, all of Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/492,510

(22) Filed: Jan. 27, 2000

(51) Int. Cl.[7] .................................................. G11C 11/00
(52) U.S. Cl. ...................... 365/154; 365/51; 365/189.02; 365/230.03
(58) Field of Search ..................... 365/154, 51, 230.03, 365/189.02, 129, 189.01, 230.01

(56) References Cited

U.S. PATENT DOCUMENTS 5,765,214 * 6/1998 Sywyk .................................. 711/213
5,787,041 * 7/1998 Hill et al. ........................ 365/189.02
6,044,028 * 3/2000 Tomohiro et al. ................... 365/200
6,072,735 * 6/2000 Komoriya et al. ................... 365/200

* cited by examiner

Primary Examiner—David Nelms
Assistant Examiner—Hoai V. Ho

(57) ABSTRACT

A static random access memory (SRAM) cell is provided that optimizes the density of memory cells in an array with the maximum speed possible in addressing the memory cells for reading and writing operations. The SRAM cell is divided into groups of SRAM arrays of cells with a centrally located distributed global decoder to address any individual memory cell in the SRAM array. The global decoder includes a first logic block that accepts addressing input and outputs a signal for selecting an individual column of memory cells in the SRAM array. The global decoder includes a second logic block that accepts addressing input and outputs a signal selecting an individual row of memory cells contained in the SRAM array. The global decoder may include a third logic block to decode addressing bits to produce a group select signal. Thus, the global decoder is able to select any signal memory cell in the SRAM cell for reading or writing specific logical states.

25 Claims, 11 Drawing Sheets

DISTRIBUTED DECODE SYSTEM AND METHOD FOR IMPROVING STATIC RANDOM ACCESS MEMORY (SRAM) DENSITY

FIELD OF THE INVENTION

The present invention generally relates to memory management and storage in a computer or other system that uses static random access memory (SRAM), and more particularly, to a distributed decode system and method for improving SRAM density.

BACKGROUND OF THE INVENTION

A typical random access memory (RAM; e.g., static RAM (SRAM) or dynamic RAM (DRAM)) system for a computer includes an array with one or more columns of SRAM cells configured to store respective logic states, i.e., either a logic high (logical "1") or a logic low (logical "0"). Data is written to and/or read from each of the SRAM cells in each column via differential complimentary bit and nbit connections. An address wordline, which is decoded from a computer address sent by a central processing unit (CPU) or other processor, is communicated to the SRAM cells. The address wordline particularly identifies and enables a specific SRAM cell during each reading and writing operation.

A write driver is designed to write data to a specific SRAM cell that is identified by an address wordline. The bit and nbit connections are initially precharged. In order to write a logic state to a particular SRAM cell, the write driver discharges one of the bit and nbit connections while maintaining the state of the other, in order to create a voltage differential between the connections and instill a particular logic state in the SRAM cell.

A sense amplifier is utilized to retrieve data from SRAM cells. The sense amplifier is typically a differential amplifier. It receives the differential complimentary signals on the bit and nbit connections and can read the stored logic state based upon the voltage differential and polarity between the connections. The sense amplifier produces a data output when prompted to do so by a strobe control signal. The strobe control signal can be a clock edge generated by some type of a timing control unit.

In order to create high-density memories requiring little space, storage elements are often made with the fewest and smallest parts possible. A problem exists, however, in that a high number of decoders are required to access the desired address wordline and column to enable a specific SRAM cell in the array. The use of the large number of decoders imposes a substantial size and component count burden on the chip. Moreover, because the arrays of memory cells in these types of configurations are large, the decoders that are required to drive signals across the arrays to overcome the resistance of the signal wires must also be large. This configuration requires large decoders to maintain the "sweet spot" which is commonly known as the optimal relationship between the resistance of the signal wires to the size of the driver that is required to overcome the resistance. Consequently, the large number of decoders required to properly address the multitude of SRAM cells combined with the requirement that the decoders themselves must be large to maintain the sweet spot, the number of SRAM cells that can be placed on a single chip is substantially limited.

In order to improve the density of SRAM cells relative to speed, a heretofore unaddressed need exists in the industry for an improved SRAM system that increases speed and reduces size and the number of required components in the chip.

SUMMARY OF THE INVENTION

An object of the invention is to overcome the deficiencies and inadequacies of the prior art, as described previously in the background section. Briefly described, the present invention provides for distributed decode system and method for improving static random access memory (SRAM) density.

With respect to architecture, the system is implemented as follows. The system includes a plurality of groups of memory cells. The groups of memory cells are comprised of first and second pluralities of memory cell columns whereby each of the columns include at least one memory cell. The individual memory cells are configured to read and write a respective logic state. The system further includes a sense amplifier in each of the groups, and it is coupled between the first and second pluralities of memory cell columns. A column multiplexer is included in each of the groups of memory cells and is coupled to the first and second pluralities of memory cell columns and the sense amplifier. Additionally, the system includes a global decoder centrally coupled to the groups of memory cells, and it is configured to select any individual said memory cell in any of the groups of memory cells according to an address instruction executed by said global decoder.

The global decoder comprises a first logic block to enable one of the columns of memory cells in one of the groups of memory cells. A second logic block is included in the global decoder to enable one of a plurality of wordlines contained in each of the groups of memory cells to either read or write a specific logic state. Thus, the first and second logic blocks in the global decoder enable one memory cell contained in the groups of memory cells by activating a particular column and wordline in the SRAM array. Once the memory cell is addressed, a logic one or a logic zero may either be written to or read from the memory cell.

An alternative embodiment of the invention provides for multiple signal paths originating from the second logic block coupled to each wordline so that each wordline includes two connection points for receiving data information. Including two signal paths from the second logic block to each wordline of each groups of wordlines eliminates any data transmission delay caused by the natural resistance and capacitance in the wordline.

Still another embodiment includes a local buffer contained in each of the groups of memory cells to perform a final stage of decode. The local buffer comprises a first local group logic block that receives input from the first logic block of the global decoder for selecting the desired column of memory cells. The local buffer also includes a second local group logic block that receives input from the second logic block of the global decoder for selecting the individual wordline contained in that particular group of memory cells. The first and second local group logic blocks only select the column and row respectively when enabled by a local group enable line contained in the local buffer. The local group enable line receives input from a third logic block contained in the global decoder which enables one group while disabling the others. If the third logic block sends a high signal to a particular group, then that group is the group that contains the desired memory cells for writing or reading a logic state to the exclusion of all other groups.

Still another embodiment involves including a third local group logic block in the local buffer so that each wordline receives the data at two points as described above. This embodiment effectively eliminates any delay caused by resistance or capacitance in long wordlines.

The invention has numerous advantages, a few of which are delineated hereafter, as merely examples.

An advantage of the invention is that it improves the speed of SRAM designs by requiring a fewer number of blocks through which to route signals.

Another advantage of the invention is that the density of the memory cells on the SRAM chip is greater because the invention minimizes the number of components required for implementation of a SRAM, particularly, significantly reducing the number of decoders required to access each individual SRAM cell.

Another advantage of the invention is that it is simple in design, reliable in operation, and easily implemented in mass production.

Other objects, features, and advantages of the present invention will become apparent to one with skill in the art upon examination of the following drawings and detailed description. It is intended that all such additional objects, features, and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating principles of the present invention. In the drawings, like reference numerals designate corresponding parts throughout the several views.

DETAILED DESCRIPTION OF THE PREFERRED EMBODIMENT

Figure 1:
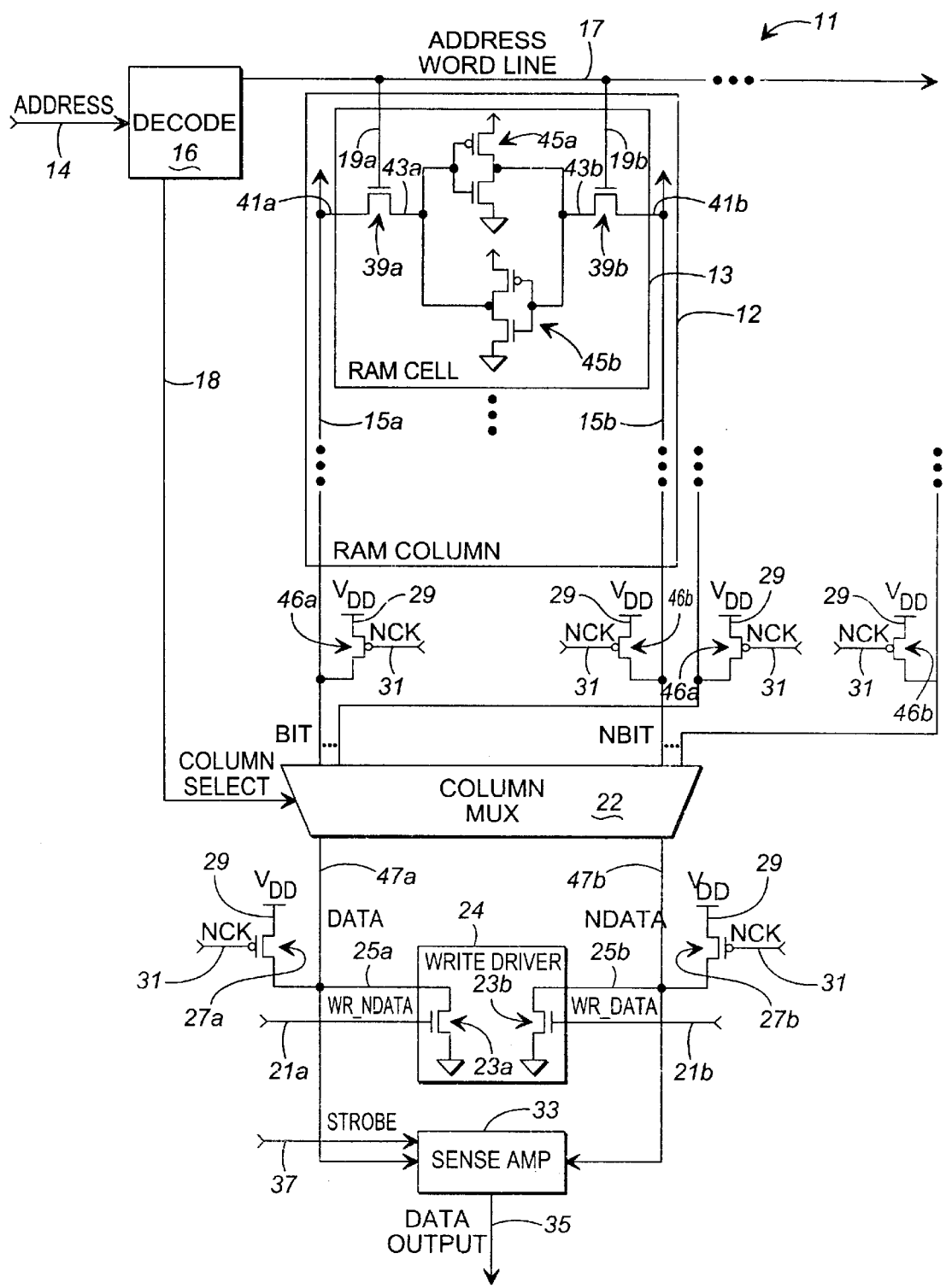
FIG. 1 is a schematic circuit diagram of a SRAM system of the prior art.

A typical static random access memory (SRAM) system in accordance with the prior art is shown in FIG. 1 and is generally denoted by reference numeral 11. The SRAM system 11 may be situated in a computer or other electronic system. The SRAM system 11 includes an array, typically two dimensional, of SRAM cells 13 configured to store respective logic states, ie., either a logic high (logical "1") or a logic low (logical "0"). The SRAM cells 13 are often arranged in one or more parallel columns 12 (each a one dimensional array).

Data is written to and read from each of the SRAM cells 13 in each column 12 via differential complimentary bit and nbit connections 15a, 15b associated with each column 12. Cells 13 are identified for reading and writing operations via a memory address 14 sent by, for example, a central processing unit (CPU) of a computer. The address 14 is decoded by a decoder 16 into an address wordline 17 and a column select 18. The former identifies a particular row in the array of the SRAM system 11, whereas the latter identifies a particular column 12.

More specifically, the address wordline is communicated on connection 17 to the rows of SRAM cells 13. The address wordline on connection 17 is bit sliced via dual rail connections 19a, 19b in order to particularly identify and enable a specific row of SRAM cells 13 during each reading and writing operation. Moreover, the column select is communicated to a multiplexer (MUX) 22 on connection 18. The MUX 22 is configured to select a particular column 12, ie., a particular pair of the bit and nbit connections 15a, 15b, based upon the column select 18.

A write driver 24 is configured to receive complimentary data 21a and ndata 21b, typically from a CPU or other processor. The write driver 24 is designed to write the data that is represented by the combination of data 21a and ndata 21b to a specific SRAM cell 13 that is identified by an address wordline 17. The write driver 24 includes a data transistor 23a (e.g., an n-type field effect transistor, or an NFET) and an ndata transistor 23b (e.g. an NFET or other type of driver). The respective sources 25a, 25b of the transistors 23a, 23b are connected to the bit and nbit connection 15a, 15b, respectively via data and ndata connections 47a, 47b through column mux 22. Further, each of these transistors 23a, 23b is actuated by signals on respective connections 21a, 21b that are passed to their respective gates.

The bit and nbit connections 15a, 15b are precharged via corresponding transistors 46a, 46b (e.g., p-type FETs, or PFETs), which are connected to the high voltage rail VDD, denoted by reference numeral 29, and which are clocked by an inverse clock (NCK) signal 31. As it is clear from the configuration in FIG. 1, the precharge transistors 27a, 27b precharge the corresponding data and ndata connections 47a, 47b while the write driver transistors 23a, 23b discharge the same, when appropriate.

A sense amplifier 33 is utilized to retrieve data from SRAM cells 13. The sense amplifier 33 is typically a differential amplifier. It receives the differential complimentary signals on the bit and nbit connections 15a, 15b and can read the stored logic state from a SRAM cell 13 based upon the voltage differential and polarity between the bit and nbit signals on connections 15a, 15b. The sense amplifier 33 produces a data output 35 when prompted to do so by a strobe control signal 37. The strobe control signal 37 can be a clock edge generated by some type of a timing control unit (not shown for simplicity).

Each SRAM cell 13 includes a pair of pass transistors 39a, 39b (e.g., NFETs). Their corresponding sources 41a, 41b are connected to the bit and nbit connections 15a, 15b. Their corresponding drains 43a, 43b are connected to an inner looped latching circuit. Their corresponding gates are connected to and actuated by respective connections 19a, 19b from the connection 17 that carries an address wordline. The latching circuit includes inverters 45a, 45b, for example, complimentary metal oxide semiconductor field effect transistors (CMOSFETs), having the input of one connected to the output of the other and the output of the other connected to the input of the one.

In operation, the differential complimentary nodes 43a, 43b are driven to either logic states "01" or logic states "10", respectively. As an example, the former set of differential logic states may collectively represent a logical 1, whereas the latter set may represent a logical 0.

Initially, the bit and nbit connections 15a, 15b are pre-charged via respective transistors 27a, 27b. Next, the address wordline 17 and the column select 18 are communicated to the array of SRAM cells 13 from, for example, the CPU. At this point, either the write driver 24 writes data to the SRAM cells 13 or the sense amplifier 33 reads data from the SRAM cells 13.

During a write operation, the write driver 24 causes one of the following: (a) the bit connection 15a is maintained at a logic high, while the nbit connection 15b is driven to a logic low from a logic high, or alternatively, (b) the bit connection 15a is driven to a logic low from a logic high, while the nbit connection 15b is maintained at a logic high. The former scenario causes the accessed cell 13 to store one logic state, such as a logic high, while the latter scenario causes the accessed cell 13 to store another logic state, such as a logic low.

During a read operation, the sense amplifier 33 senses the bit and nbit connections 15a, 15b. One of two possible signal configurations should exist: (a) the bit connection 15a is at a logic high, while the nbit connection 15b is at a logic low, or alternatively, (b) the bit connection 15a is at a logic low, while the nbit connection 15b is at a logic high. The former scenario causes the sense amplifier 33 to conclude that the accessed cell 13 is at one logic state, such as a logic high, while the latter scenario causes the sense amplifier 33 to conclude that the accessed cell 13 is at another logic state, such as a logic low.

For a read operation, the nbit connection 15b is driven to a logic low, while the bit connection 15a is maintained at a logic high, by the ram cell 13. As the nbit connection transcends from high voltage, the strobe control signal 37 is triggered at a point when the nbit signal establishes a sufficient disparity between the bit and nbit signals. In a specific example of a possible embodiment, the bit signal is about 3.3 volts (v) and the strobe control signal 37 is triggered when the nbit signal differs from VDD by about 100 millivolts (mv) to 1 v.

The sense amplifier 33 can read the states of the nodes 43a, 43b, and drive an appropriate logical state 35 when prompted to do so by the strobe control signal 37.

Figure 2:
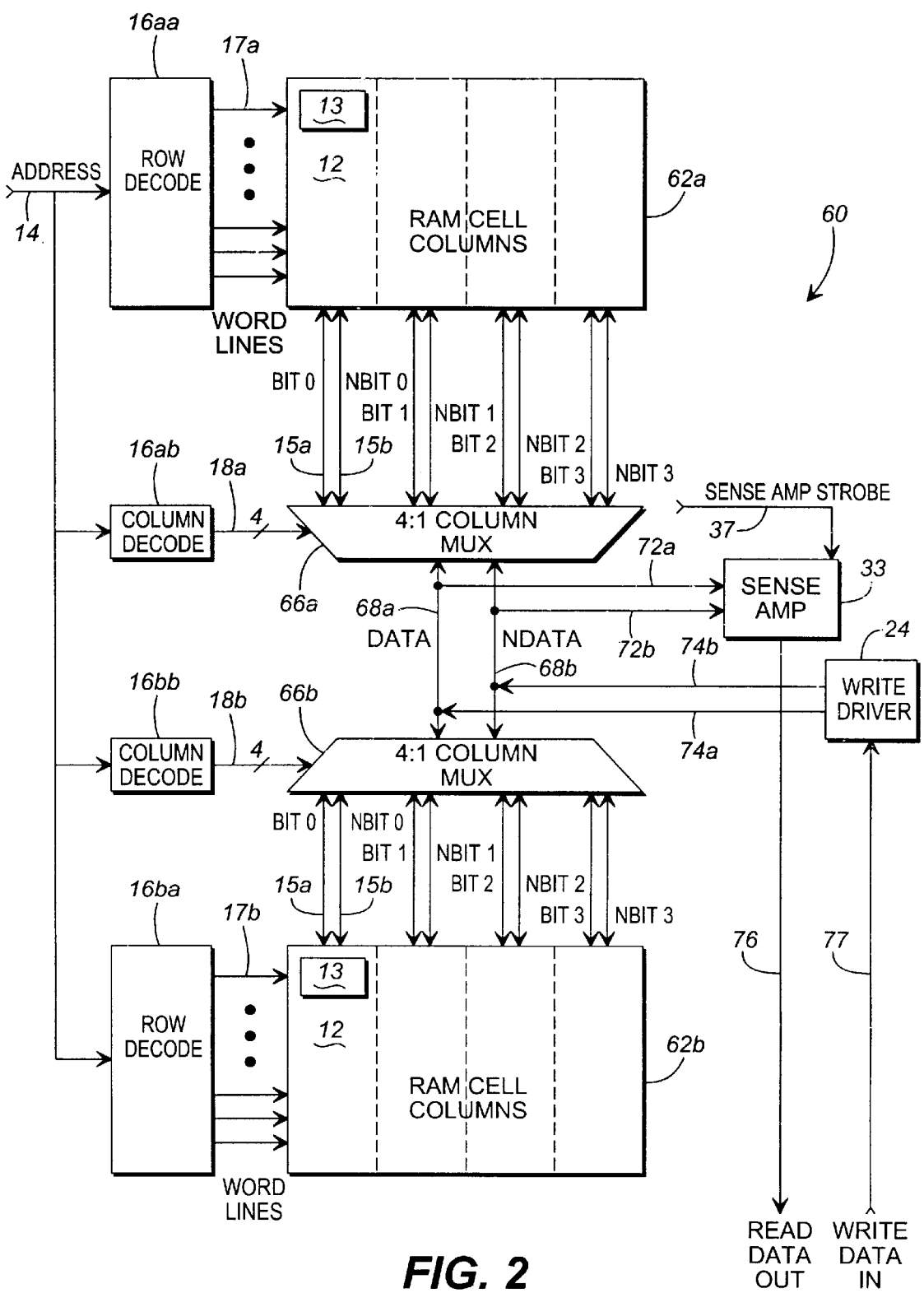
FIG. 2 is a schematic circuit diagram of an SRAM depicted in FIG. 1 that includes a plurality of row and column decoders thereby reducing the maximum space for SRAM memory.

FIG. 2 is a systematic circuit diagram showing a typical static random access memory (SRAM) system with the multiple number of decoders necessary to access each SRAM memory cell. The sense amplifier 33 and write driver 24 are placed in the center of the SRAM array, and the bit and nbit connections 15a, 15b are split in half.

The SRAM 60 includes a first and second pluralities 62a, 62b of memory cell columns 12. Each column 12 includes one or more SRAM cells 13, and each SRAM cell 13 is configured to store a respective logic state of either a logic one or a logic zero. The SRAM cell 13 may be constructed as previously described and illustrated in FIG. 1.

Logic is configured to multiplex access to the first and second pluralities 62a, 62b of SRAM cell columns 12 to enable reading and writing operations relative to the SRAM cells 13. In this regard, a first multiplexer 66a, for example, a four-to-one multiplexer, is configured to multiplex differential pairs (e.g., bit 3, nbit 3; bit 2, nbit 2; bit 1, nbit 1; bit 0, nbit 0) of bit and nbit connections 15a, 15b between the first plurality 62a and both the sense amplifier 33 and the write driver 24. A second multiplexer 66b, for example, a four-to-one multiplexer, is configured to multiplex differential pairs (e.g. bit 3, nbit 3; bit 2, nbit 2; bit 1, nbit 1; bit 0, nbit 0) of bit and nbit connections 15a, 15b between the second plurality 62b and both the sense amplifier 33 and the write driver 24.

Data is written to and read from each of the SRAM cells 13 in each column 12 via the differential complimentary bit and nbit connections 15a, 15b associated with each column 12. Cells 13 are identified for reading and writing operations via the memory address 14 sent by, for example, a central processing unit (CPU) of a computer. The address 14 is decoded by a decoder 16 that is generally comprised of a row decoder 16aa, a column decoder 16ab, a row decoder 16ba, and a column decoder 16bb. The row decoder 16aa and the column decoder 16ab are allocated to the first plurality 62a of columns 12, while the row decoder 16ba and the column decoder 16bb are allocated to the second plurality 62b of columns 12. The row decoder 16aa decodes the address 14 into address wordlines 17a that are passed to respective rows of cells 13 of the first plurality 62a. Moreover, the column decoder 16ab produces a column select 18a a connection 4 based upon the address 14 for controlling the MUX 66a. Similarly, the row decoder 16ba decodes the address 14 into address wordlines 17b that are passed to respective rows of cells 13 in the second plurality 62b. Moreover, the column decoder 16bb produces a column select 18b along a connection 4 based upon the address 14 for controlling the MUX 66b.

The sense amplifier 33 is configured to read the bit and nbit connections 15a, 15b of the first and second pluralities 62a, 62b of RAM cell columns 12 via the first and second multiplexers 66a, 66b, respectively. The sense amplifier 33 is configured to output any logic state from any of the RAM cells 13 based upon a voltage differential and a polarity between the bit and nbit connections 15a, 15b, which are channeled to the sense amplifier 33 via connections as indicated by reference arrows 68a, 68b and 72a, 72b. The sense amplifier 33 is further configured to output the data, as indicated by reference arrow 76.

The write driver 24 is configured to write data to the bit and nbit connections 15a, 15b and ultimately to a particular RAM cell 13 via respectively the first and second multiplexers 66a, 66b. The write driver 24 is configured to drive any logic state onto any of the RAM cells 13 based upon the voltage differential and polarity between the bit and nbit connections 15a, 15b. The write driver 24 connects to each set of bit and nbit connections 15a, 15b via respective connections 74a, 74b and 68a, 68b. The write driver 24 receives data from a CPU or other processor, as indicated by reference arrow 77.

An arrangement of a plurality of SRAM 60 results in an increased size of row decoders 16aa, 16ba and an increased size of column decoders 16ab, 16bb required to drive a large number of memory cells 13. As discussed above, a substantial amount of the finite space available for components is taken by the large decoders 16. Thus, a fewer number of SRAM cells can be implemented in the finite space thereby decreasing the maximum memory capacity of the SRAM. The present invention overcomes this deficiency by utilizing a minimum number of decoders in a global decode block of the SRAM the can access any memory cell in the SRAM thereby eliminating the requirement for the plurality of decoders 16.

Figure 3:
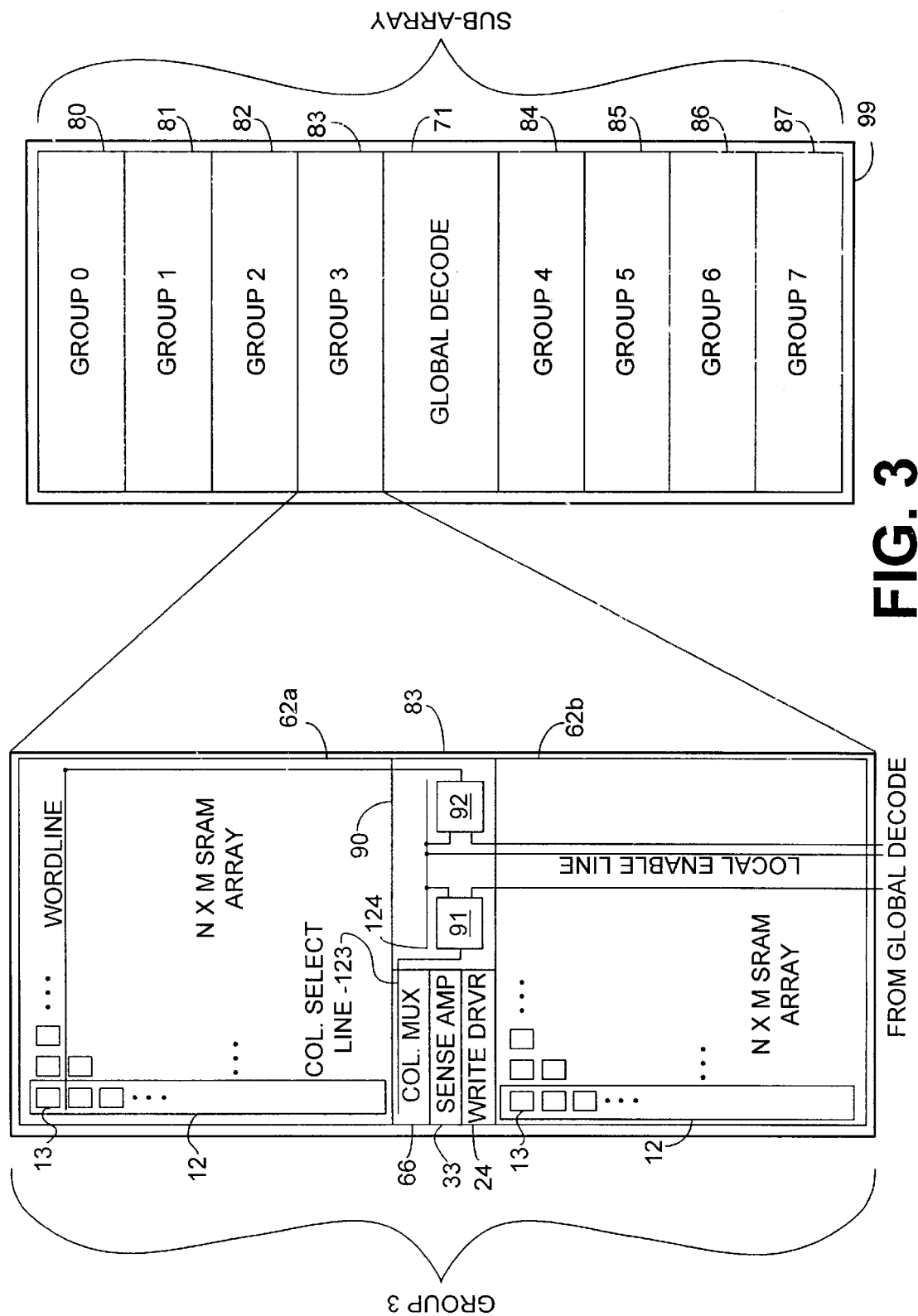
FIG. 3 is a diagram of the SRAM Sub-Array with a distributed global decoder of the present invention with an exploded view of one SRAM group.

FIG. 3 is a block diagram of an SRAM Sub-Array 99 with an exploded view of an SRAM group 83 contained in the SRAM Sub-Array 99. SRAM Sub-Array 99 is an arrangement of SRAM groups situated around a global decode 71. SRAM Sub-Array 99 contains eight groups which are similar to the SRAM depicted in FIG. 2 but without the decoders 16. Groups 0–3 (reference numerals 80–83 respectively) are situated on one side of the global decoder 71, and Groups 4–7 (reference numerals 84–87 respectively) placed on the opposite side of the global decoder 71. Group 3 SRAM 83 is shown in an exploded view to the left of SRAM Sub-Array 99 in FIG. 3. Group 3 SRAM 83 is similar to the SRAM 60 depicted in FIG. 2 without the row decodes 16aa, 16ba, and the column decodes 16ab and 16bb. Group 3 SRAM 83 includes a first and second pluralities of N×M SRAM Array 62a, 62b of memory cell columns 12. Each column 12 includes one or more SRAM cells 13, and each SRAM cell 13 is configured to store a respective logic state of either a logical 1 or a logical 0. A column multiplexor 66, a sense amplifier 33, and a write driver 24 are coupled between the first and second pluralities of N×M SRAM Arrays 62a, 62b. In this nonlimiting example, a local buffer 90 is coupled between the first and second pluralities of N×M SRAM Arrays 62a, 62b to assist in addressing individual memory cells 13.

The local buffer 90 includes a first local logic element 91 that is configured to select the column of the memory cell address for the reading or writing operation. A second logic block 92 is included in the local buffer 90 to route incoming signals to the desired memory cell 13. The first and second local logic blocks 91, 92 do not relay signals to the memory cell 13 unless they are enabled to do so by command transferred along input local enable line 124. If local group enable line 124 is high, then first and second local logic blocks 91, 92 will operate to select the individual memory cell 13 for the reading and writing operation. If local enable line 124 is low, then first and second local logic blocks 91, 92 will not transfer any signal to any memory cell 13 contained in either first or second pluralities of N×MSRAM Array 62a,62 b of Group3 SRAM 83.

Figure 4A:
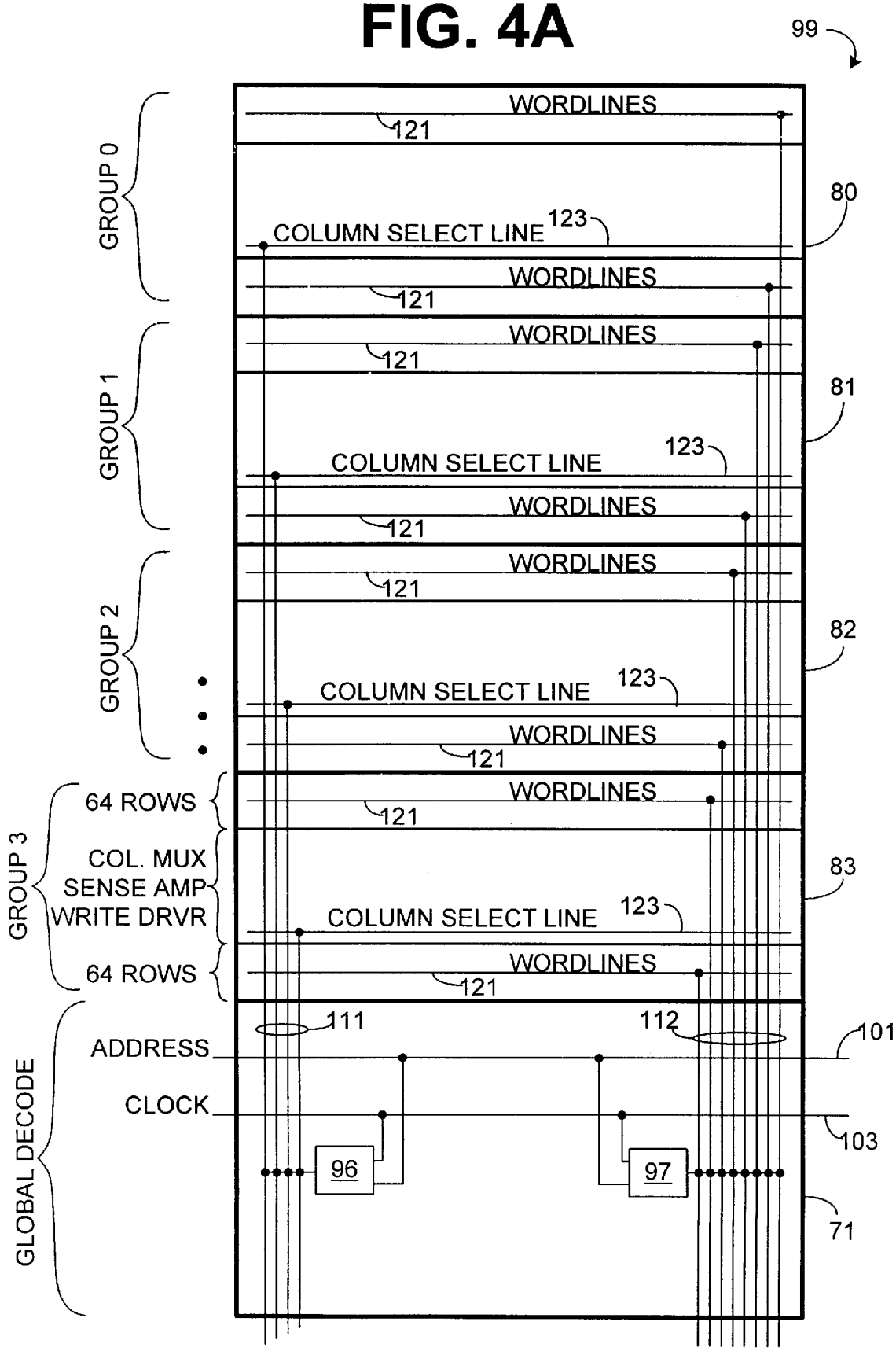
FIGS. 4A and 4B are a schematic circuit diagram of the SRAM Sub-Array of FIG. 3 showing how the global decoder enables the desired column and wordline of a particular group of memory cells.
Figure 4B:
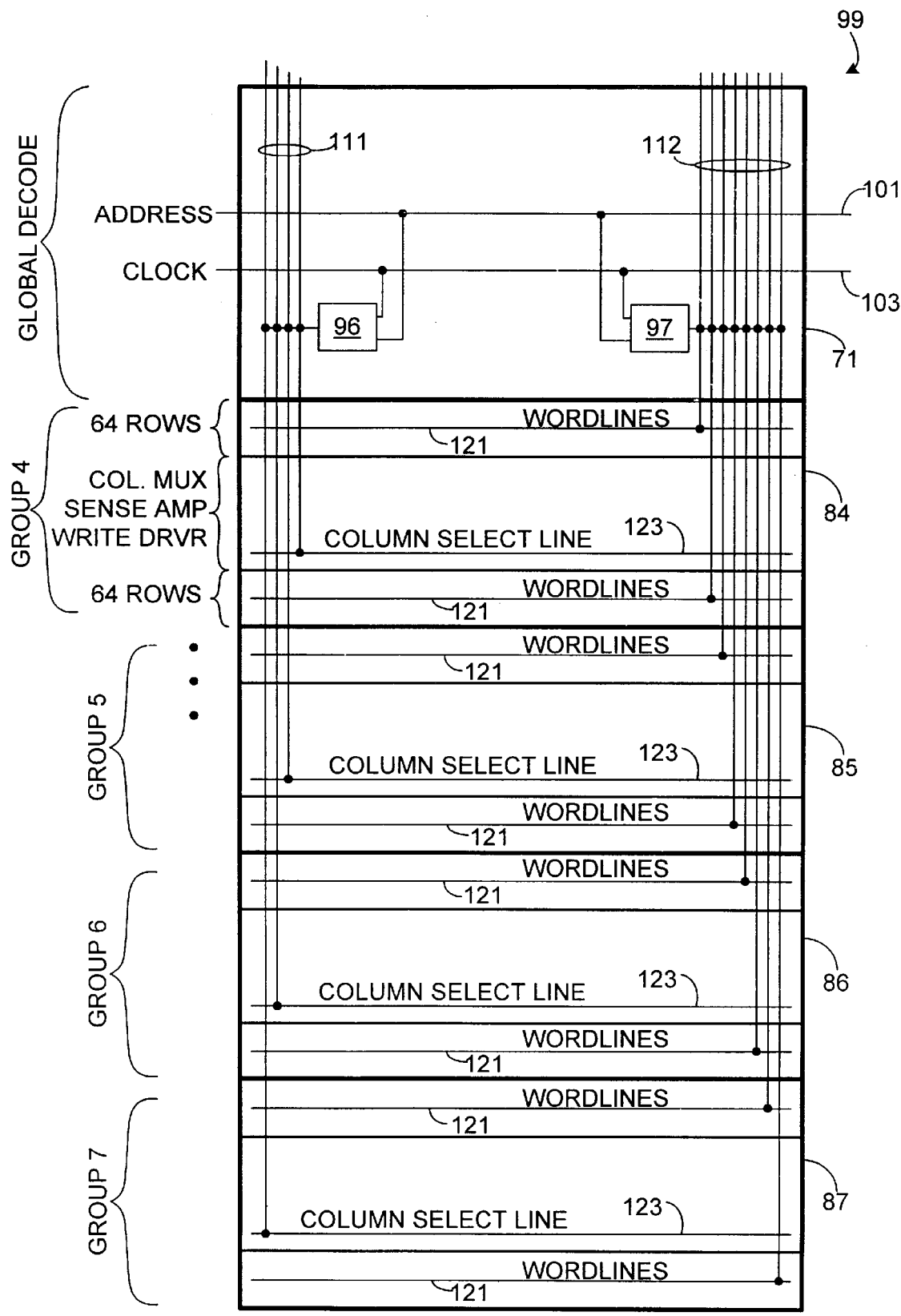

FIGS. 4A and 4B are a split view of SRAM Sub-Array 99 in FIG. 3. FIG. 4A shows Groups 0–3 of SRAM Sub-Array 99 and also the global decoder 71. FIG. 4B similarly depicts the global decoder 71 with Groups 4–7 of SRAM Sub-Array 99. In the nonlimiting example depicted in FIGS. 4A and 4B, Groups 0–7 include 64 rows of memory cells 13 in the first and second pluralities of N×M SRAM arrays 62a, 62b. Similarly, coupled between SRAM arrays 62a, 62b are column multiplexor 66, sense amplifier 33, and write driver 24.

Turning to FIG. 4A, the global decoder 71 receives an address input on address input line 101. A clocked input is received by the global decoder 71 along clock line 103. A first logic block 96 is utilized in the global decoder 71 to enable one of the columns 12 in one of the Groups 0–7 (reference numerals 80–87) for reading and/or writing operations. The first logic block 96 is a typical decoder that receives a portion of an address with an output to enable a single column of memory cells in a column mux. As a non-limiting example, if there are eight columns of memory cells in each column mux in each of the eight groups 0–7 in which signals could be routed, a typical 6-bit decoder may be utilized such that it will include eight possible outputs to be able to address any of the eight columns in each column mux in any of the groups of the SRAM Sub-Array 99. Thus, the output from the first logic block 96 is routed along connection 111 to a single column in each column mux in each eight groups.

Global decoder 71 also includes a second logic block 97 configured to communicate with one of the groups of the memory cells to enable one of the plurality of wordlines 17 for addressing an individual SRAM cell 13. As a nonlimiting example, if there are has two sets of 64 wordlines in each group which must be individually addressed, then second logic block 97 must be at least a 10-bit decoder to allow for each potential addressing configuration. Once the second logic block 97 has decoded the address for the individual wordline in which the signal must be routed, the output from second logic block 97 travels along signal lines 112, to the desired group in SRAM Sub-Array 99, and finally to wordlines 121 for addressing the desired memory cell 13.

In operation, the global decoder 71 receives a portion of an address line 101. The address input line is coupled to each of the logic blocks 96, 97 in global decoder 71. The operation of each of the logic blocks 96, 97 are controlled by a clock input to the global decoder 71 along clock input line 103. As stated in the examples above, first logic block 96 may be a 6-bit decoder, and second logic block 97 may be a 10-bit decoder. Thus, 13 bits are required to address any individual memory cell 13 in SRAM Sub-Array 99. The first three bits of the address direct first logic block 96 to select one of the eight columns in each column mux in any of the groups 0–7, and the last ten bits select the individual wordline in one of the eight groups 0–7.

Figure 5A:
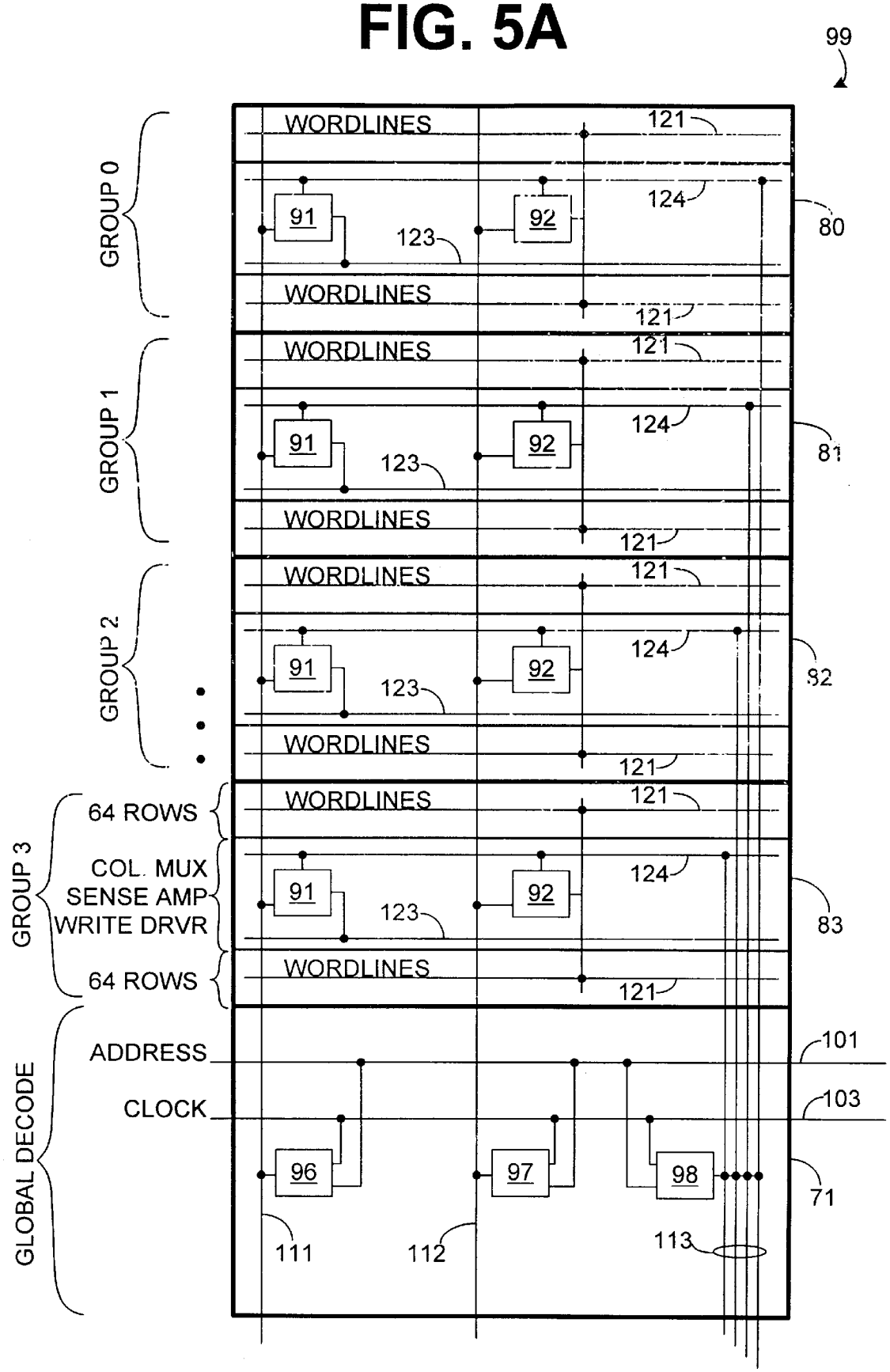
FIGS. 5A and 5B are a schematic circuit diagram of the SRAM Sub-Array of FIG. 3 showing the global decoder and how it interacts with a local buffer contained in each group of memory cells to enable the desired column and wordline of a particular group of memory cells.
Figure 5B:
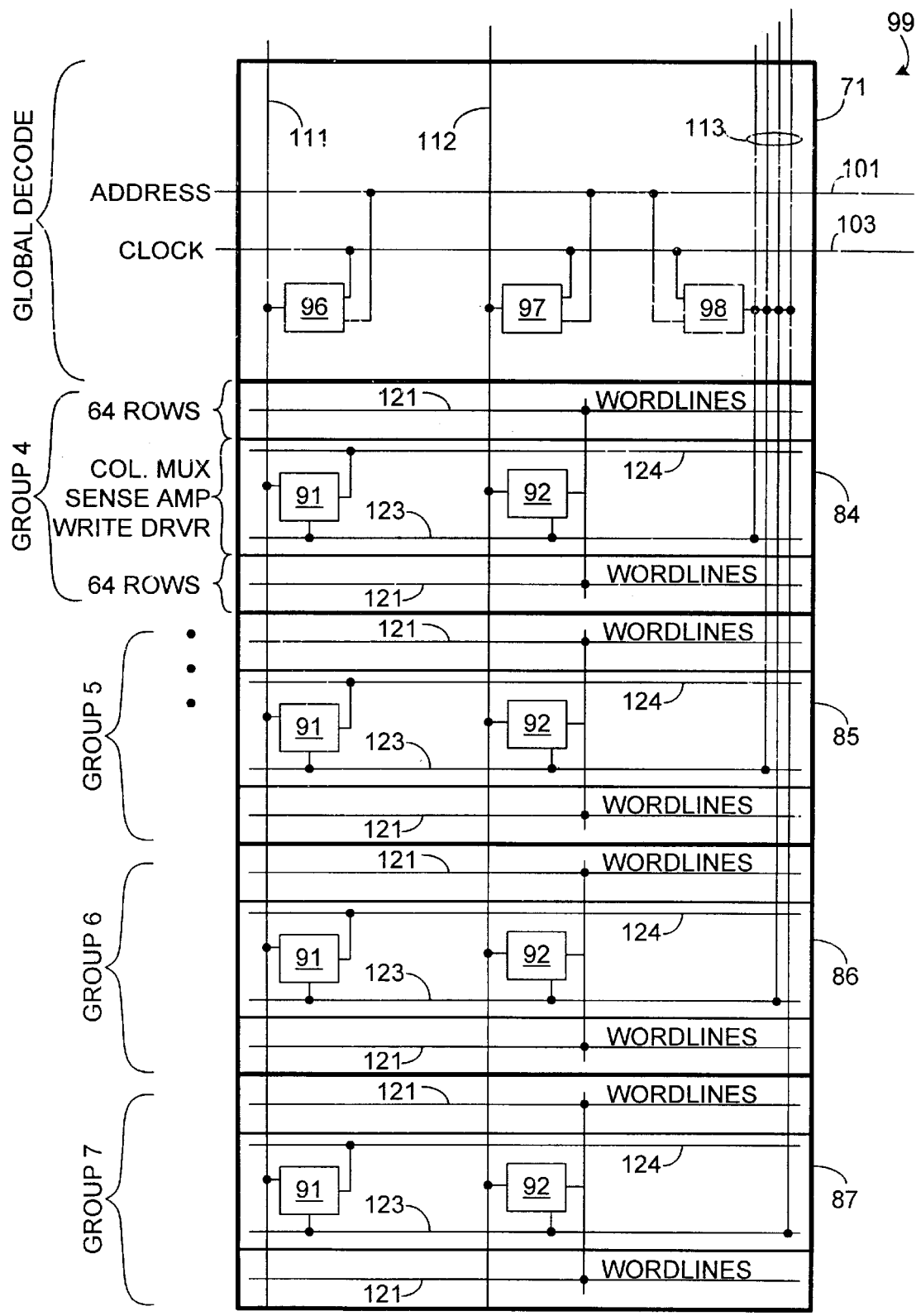

FIGS. 5A and 5B are a schematic diagram depicting an alternative embodiment of the present invention. In this embodiment, the global decoder 71 includes an address input line 101 and a clock input line 103. A first logic block 96 is included to route an incoming address to the desired column in each column mux of one of the eight groups of SRAM Sub-Array 99. A second logic block 91 is implemented to select a desired wordline 121 contained in one of the eight groups included in SRAM Sub-Array 99. A third logic block 98 is included to enable one of the eight groups to be active for either reading or writing a specific logic state to one of the memory cells 13 contained in that group. As anon-limiting example, third logic block 98 may be a 3-bit decoder so as to route signals received on address line 101 to eight possible combinations, which in this case are represented by groups 0–7 in FIGS. 5A and 5B. The output from third logic block 98 travels upon signal lines 113 to each local enable line 124 contained in each group. The output from third logic block 98 only enables a single group in the SRAM Sub-Array 99 at a time.

As previously discussed, a local buffer 90 is contained within each of the eight groups of SRAM Sub-Array 99 for performing a final stage of decode. Contained in each local buffer 90 is a first local group logic block 91 that is coupled to signal line 111 for receiving input from first logic block 96. The first local group logic block is also coupled to local group enable line 124 for receiving input from third logic block 98. When the first logic block 96 outputs an address along signal line 113, the data is transferred to the local group logic block 91 contained in every group of SRAM Sub-Array 99. The address information which pertains to the desired column 12 that contains memory cell 13 is not activated unless that individual group local enable line 124 is in a high state. Thus, as an non-limiting example, if third logic block 98 transfers a signal along line 113 to local enable line 124, first local group logic block 91 will transfer address information to the desired column contained in group 3 SRAM 83 via column select line 123. In this example, no other first logic block 91 in groups 0–2 and 4–7 will transfer this information because local enable wire 124 is not in a high state.

The local buffer 90 also contains a second local group logic block 92 to select the individual wordline 121 in the group in which the local buffer 90 resides. As yet another non-limiting example, second logic block 97 outputs an address along signal lines 112 that is relayed to all the groups in SRAM Sub-Array 99. Each second local group logic block 92 receives this information along signal lines 112; however, only a single second local group logic block 92 will transfer this information to a wordline 121 so that the signal is ultimately transferred to memory cell 13. The third logic block 98 must output an address for one of the eight groups in SRAM Sub-Array 99 which is transferred along local enable wire 123 for activating a second local group logic block 92. In this nonlimiting example, when the second local group logic block 92 contained in group 3 SRAM 83 receives input from local enable wire 124, the second local group block 92 will relay the data to the addressed wordline 121 contained in group 3 SRAM 83. Thus, the local buffer 90 is able to perform a final stage of decode in properly addressing the correct column 12 and wordline 121 to access the desired memory cell 13 in the group of SRAM Sub-Array 99. In this configuration, a fewer number of decoders are required as opposed to the configuration in FIG. 2 creating a greater amount of space in the SRAM for a greater number of memory cells 12. As a result, the configuration of the present invention increases the storage capacity of the SRAM.

Figure 6A:
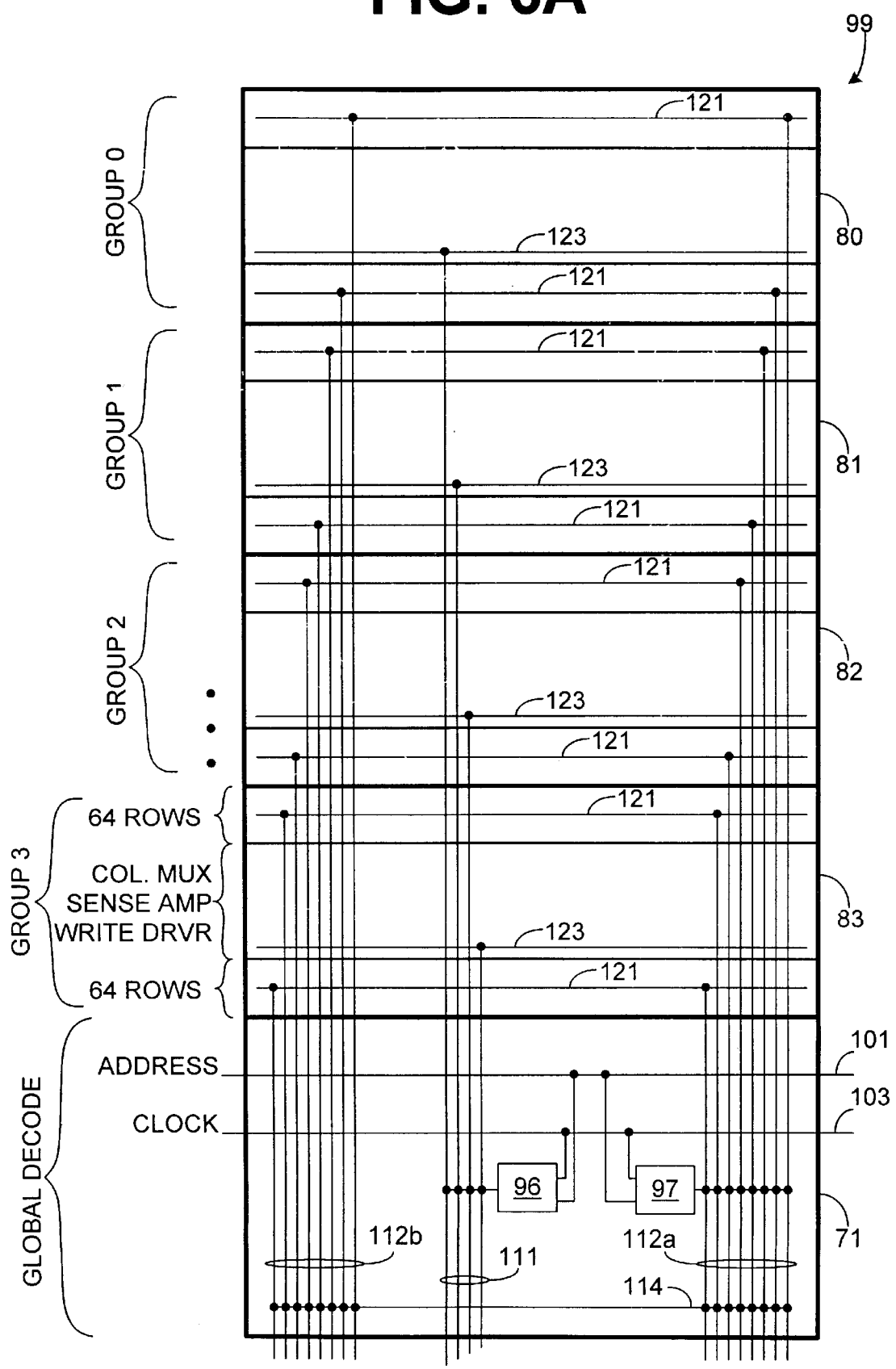
FIGS. 6A and 6B are a schematic circuit diagram of the SRAM Sub-Array of FIG. 3 showing a pair of signal lines originating from the second logic block and the duplicate second logic block to enable two couple points on every wordline to reduce any delay caused by resistance or capacitance in the wordlines.
Figure 6B:
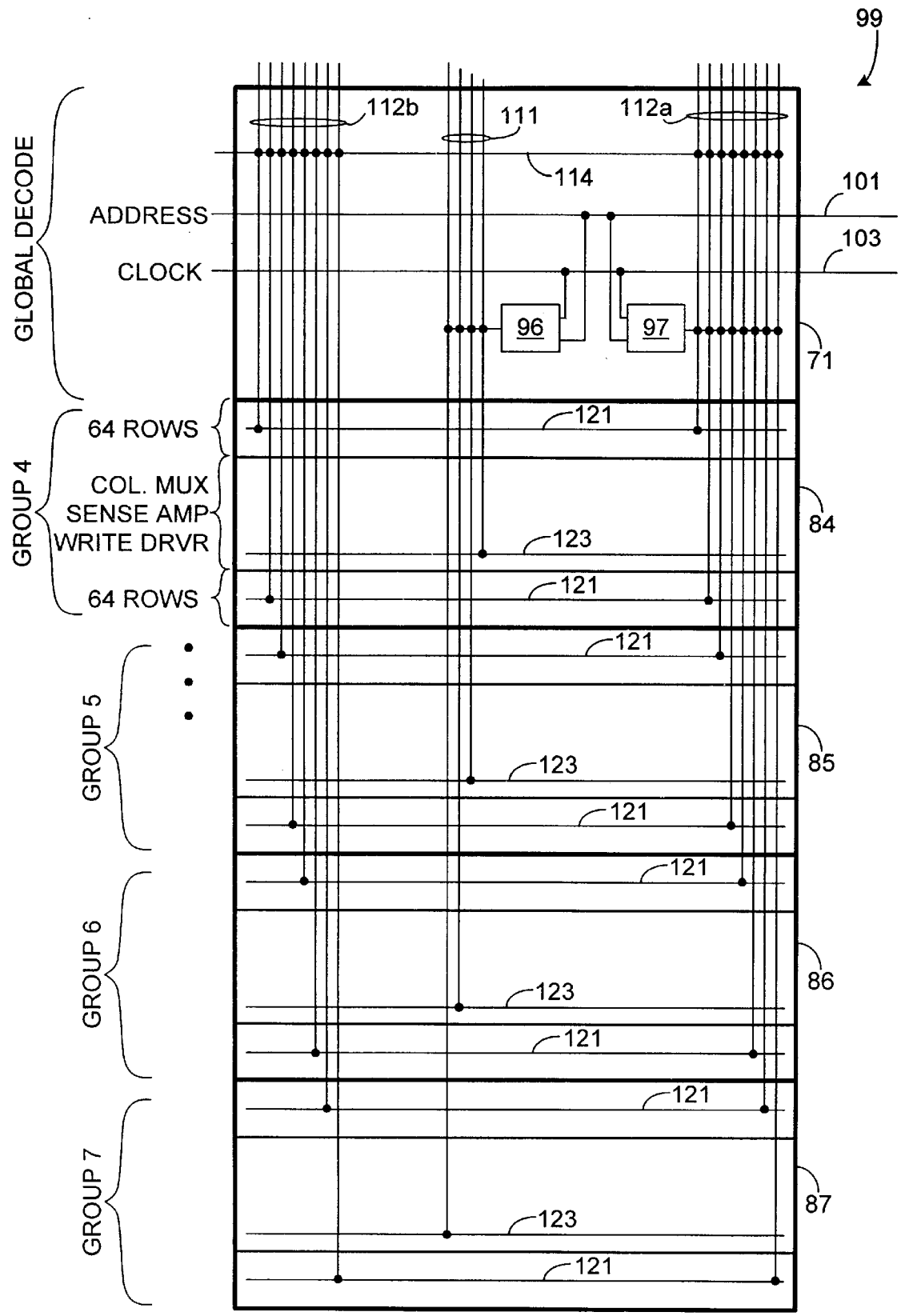

FIGS. 6A and 6B are a schematic diagram of yet another embodiment of the present invention. In this embodiment, multiple signal lines are routed from the global decoder 71 to multiple points of the same wordlines 121 in each of the eight groups of SRAM Sub-Array 99. As a non-limiting example to depict this alternative embodiment of the invention, second logic block 97 outputs the address along signal lines 112a to wordlines 121 in groups 0–7. A connector line 114 is included in global decoder 71 to also route the signal from signal line 112a to signal lines 112b. The output from second logic block 97 is communicated across connector 114, to signal lines 112b, and finally onto wordlines 121 in each of groups 0–7. Signal lines 112b connect to wordlines 121 at a point that is distal from the connection point of signal lines 112a to wordlines 121. By routing the addressing information to the wordlines 121 at two different points, any delay that might be experienced due to resistance or capacitance in the wordline is overcome.

The first logic block 96 accepts input from the address input line 101 and the clock input line 103 to decode the address for the selected column in one of the groups of SRAM Sub-Array 99. The output from the first logic block 96 is routed along signal line 111 to the column select lines 123 in each of the eight groups. The individual memory cell 13 that is selected is the one that resides in both the selected column and the selected row of memory cells whose wordline 121 is high.

Figure 7A:
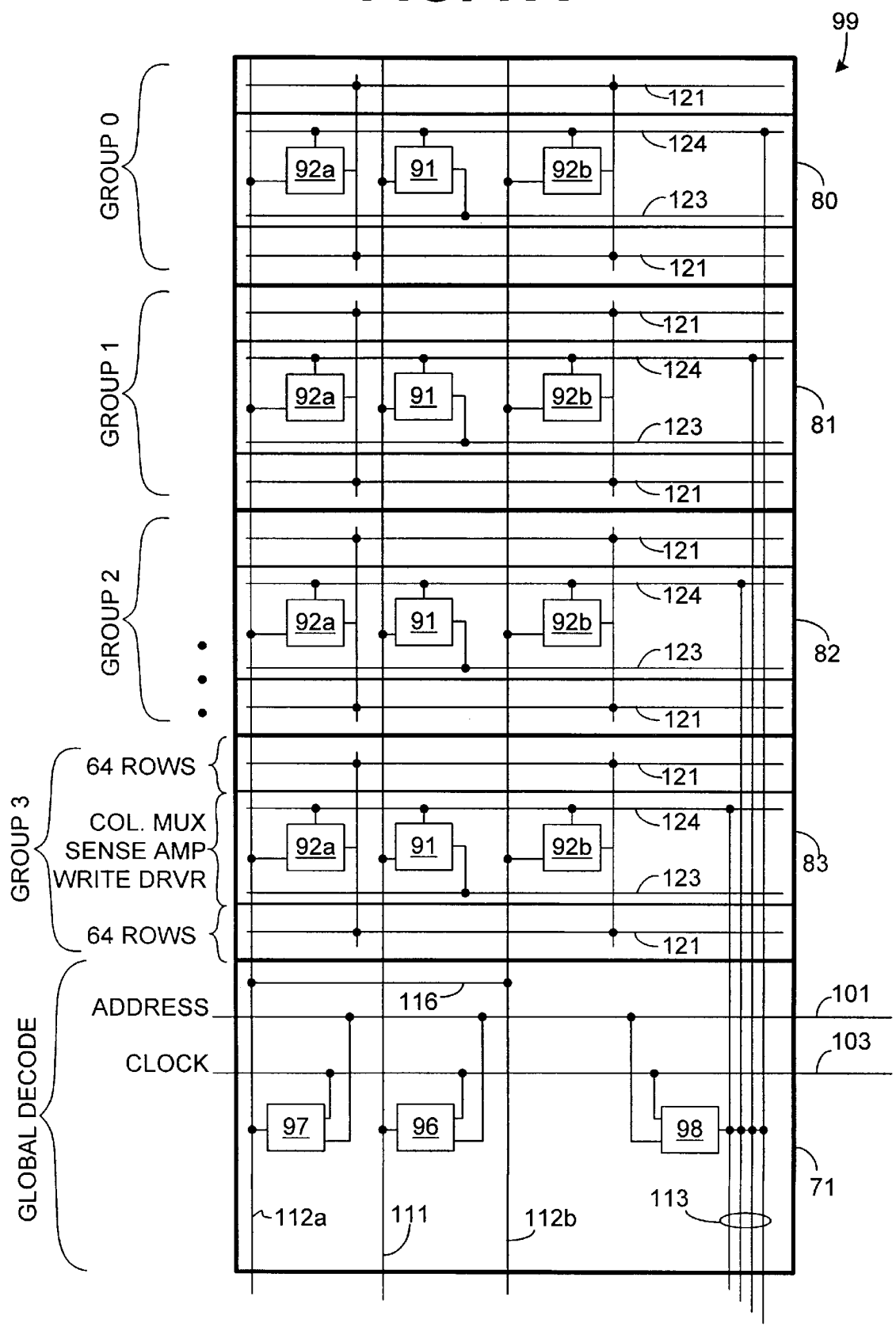
FIGS. 7A and 7B are a schematic circuit diagram of the SRAM Sub-Array of FIG. 3 showing a pair of signal lines originating from the second logic block to a second local group logic block and a third local group logic block in each groups so as to create two couple points on every wordline for eliminating any delay caused by resistance or capacitance in the wordlines.
Figure 7B:
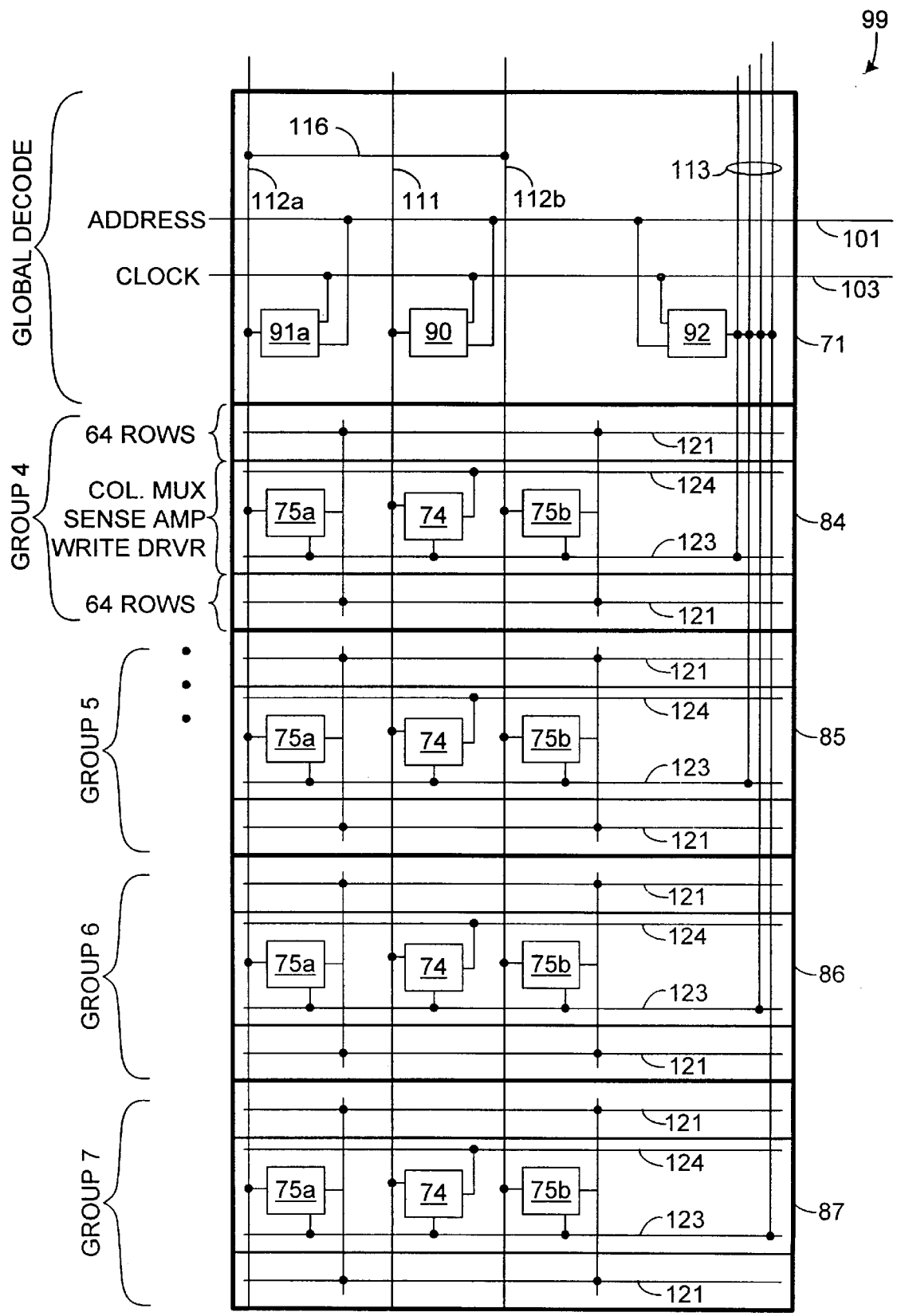

As yet another non-limiting example, FIGS. 7A and 7B are schematic diagrams which employ a local buffer 90 utilizing duplicate wiring to address the wordlines for overcoming resistance/capacitance delay. In this embodiment, the third logic block 98 is incorporated to receive address information 101 for enabling one of the groups contained in SRAM Sub-Array 99 and disabling all other groups. The output from the third logic block 98 is transferred along signal lines 113 to the local group enable lines 124 in each of the groups 0–7; however, only one of the local group enable lines 124 will go high thereby enabling that group. All other groups' local group enable line will remain low so as to disable that group of memory cells. Thus, as a nonlimiting example, the third logic block may receive an address instruction requiring that group 3 SRAM 83 be enabled. The signal would be routed along signal lines 113 to cause the local group enable line 124 in group 3 SRAM 83 to be high and the local group enable lines in groups 0–2 and 4–7 to be low. As a result, group 3 SRAM 83 is enabled for either reading or writing a specific logical state.

A first logic block 96 is implemented to receive an address from address input line 101 to route data to a local buffer 90 in one of the groups 0–7. Output from first logic block 96 is transferred along signal line 111 to local buffer 90 of each group 0–7. Contained in each local buffer 90 of each group is a first local group logic block 91 for selecting the column 12 in that particular group. In continuing the non-limiting example from above, the first local group logic block 91 in group 3 SRAM 83 will be the only first local group logic block to select a column because only the local group enable line 124 in group 3 SRAM 83 is high. The first local group logic block 91 in group 3 SRAM 83 thereafter routes the address information to the appropriate column of memory cells 12 via the column select line 123.

The local buffer 90 in each of the groups 0–7 also contain a second local group logic block 92a and a third local group logic block 92b. The third local group logic block 92b is identical to the second local group logic block 92a: however, it is connected to the individual wordlines 121 at a distal point from where the second group logic block 92a connects to the wordlines. By introducing the addressing information to the wordlines 121 at two different points on the wordlines 121, any resistance or capacitance that may be experienced on the wordline can be overcome. Second local group logic block 92a and third local group logic block 92b receive address information along address line for addressing an individual wordline contained in one of the groups 0–7 of SRAM Sub-Array 99.

In operation, second logic block 97 in the global decoder 71 receives address information 101 for routing data to the second local group logic block 92a and the third local group logic block 92b contained in the eight groups. The output from second logic block 97 is transferred along signal lines 112a to the second local group logic blocks 92a and along signal lines 112b to the third local group logic blocks 92b. The signal line 112b is coupled to signal line 112a via connection 116 between signal lines 112a and 112b. From there, the addressing information to the second local group logic block 92a and the third local group logic block 92b in each local buffer 90. The second local group logic block 92a and the third local group logic block 92b of any group will only execute the address instruction if the local group enable line 124 is high for that particular group. Thus, if group 3 SRAM 83 is enabled, then the second local group logic block 92a and the third local group logic block 92b in group 3 SRAM 83 will route the inputted data to a single wordline 121. Finally, data is either written to or read from the targeted memory cell 13.

It should be obvious that the present invention permits a multitude of SRAM Sub-Arrays 99 to be adjacently placed on a memory chip. Each SRAM Sub-Array 99 is address by a separate global decoder 71. The benefit of this configuration is increased density because of the reduction in the number of decoders over the prior art as discussed above.

It should be emphasized that the above-described embodiments of the present invention, particularly, any quote "preferred" embodiments, are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention as protected by the following claims.

What is claimed is:

1. A static random access memory, comprising:
   a plurality of groups of memory cells, said groups of memory cells having first and second pluralities of memory cell columns, each of said columns including at least one memory cell, wherein each memory cell is configured to read and write a respective logic state;
   a sense amplifier in each of said groups coupled between said first and second pluralities of memory cell columns;
   a column multiplexer in each of said groups coupled to said first and second pluralities of memory cell columns and said sense amplifier; and
   a global decoder centrally coupled to said groups of memory cells, said global decoder configured to select any individual row of said memory cells in any of said groups of memory cells according to an address instruction executed by said global decoder, wherein said row contains at least one said memory cell.

2. The static random access memory of claim 1, further comprising:
   a first logic block contained in said global decoder configured to enable one of said columns of memory cells contained in one of said group of memory cells.

3. The static random access memory of claim 2, wherein said first logic block obtains an address instruction from said address line coupled to said global decoder and operates according to a clock input coupled to said global decoder.

4. The static random access memory of claim 2, further comprising:
   a first communication path coupled to said plurality of wordlines; and
   a second logic block contained in said global decoder configured to communicate with one of said groups of memory cells by said first communication path to enable one of a plurality of wordlines contained in said first and second pluralities of memory cell columns, wherein said wordline enables one of said rows of memory cells to either read or write a specific logic state.

5. The static random access memory of claim 4, wherein said second logic block obtains said address instruction from an address line coupled to said global decoder and operates according to a clock input coupled to said global decoder.

6. The static random access memory of claim 1, further comprising:
   a computer to utilize said static random access memory for reading and writing specific logic states.

7. A method for configuring a static random access memory, comprising the steps of:
   implementing a plurality of groups of memory cells, said groups of memory cells having first and second pluralities of memory cell columns, each of said columns including at least one memory cell wherein each memory cell is configured to read and write a respective logic state;
   causing a voltage differential in said groups of memory cells to be detected wherein said logic state is recognized;
   causing logic to multiplex access to said first and second pluralities of memory cells; and
   causing the selection of any individual row of said memory cells and any individual said memory cell column in any of said groups of memory cells by centrally decoding an address instruction, wherein said row contains at least one said memory cell.

8. The method of claim 7, further comprising the step of:
   enabling one of said columns of memory cells contained in one of said group of memory cells for reading or writing a specific logic state according to said centrally decoded address instruction.

9. The method of claim 8, further comprising the steps of:
   enabling one of a plurality of wordlines contained in said first and second pluralities of memory cell columns according to said centrally decoded address instruction, wherein said wordline enables one of said rows of memory cells to either read or write a specific logic state.

10. The method of claim 9, further comprising the step of:
    causing said centrally decoded address instruction that enables one of said rows of memory cells to either read or write a specific logic state to be communicated to said plurality of wordlines at two or more points on said wordline so as to reduce delay caused by resistance or capacitance in said wordline.

11. A static random access memory, comprising:
    a plurality of groups of memory cells, said groups of memory cells having first and second pluralities of memory cell columns, each of said columns including at least one memory cell, wherein each memory cell is configured to read and write a respective logic state;
    a sense amplifier in each of said groups coupled between said first and second pluralities of memory cell columns;
    a column multiplexer in each of said groups coupled to said first and second pluralities of memory cell columns and said sense amplifier;
    a global decoder centrally coupled to said groups of memory cells, said global decoder configured to select any individual row of said memory cells in any of said groups of memory cells according to an address instruction executed by said global decoder, wherein said row contains at least one said memory cell;
    a first logic block contained in said global decoder configured to enable one of said columns of memory cells contained in one of said group of memory cells;
    a first communication path coupled to said plurality of wordlines;
    a second logic block contained in said global decoder configured to communicate with one of said groups of memory cells by said first communication path to enable one of a plurality of wordlines contained in said first and second pluralities of memory cell columns, wherein said wordline enables one of said rows of memory cells to either read or write a specific logic state; and
    a second communication path coupled to said second logic block and to said plurality of wordlines in each of said groups of memory cells distally from the point that said first communication path is coupled to said plurality of wordlines so as to eliminate delay caused by resistance or capacitance in said wordline, wherein said second communication path operates to enable one of said rows of memory cells to either read or write a specific logic state.

12. The static random access memory of claim 11, wherein said first and second logic blocks obtain said address instruction from said address line coupled to said global decoder and operate according to a clock input coupled to said global decoder.

13. The static random access memory of claim 11, further comprising:

a computer to utilize said static random access memory for reading and writing specific logic states.

14. The static random access memory of claim 11, wherein said third logic block obtains said address instruction from an address line coupled to said global decoder and operates according to a clock input coupled to said global decoder.

15. A static random access memory, comprising:

a plurality of groups of memory cells, said groups of memory cells having first and second pluralities of memory cell columns, each of said columns including at least one memory cell, wherein each memory cell is configured to read and write a respective logic state;

a sense amplifier in each of said groups coupled between said first and second pluralities of memory cell columns;

a column multiplexer in each of said groups coupled to said first and second pluralities of memory cell columns and said sense amplifier;

a global decoder centrally coupled to said groups of memory cells, said global decoder configured to select any individual row of said memory cells in any of said groups of memory cells according to an address instruction executed by said global decoder, wherein said row contains at least one said memory cell;

a first logic block contained in said global decoder configured to enable one of said columns of memory cells contained in one of said group of memory cells;

a first communication path coupled to said plurality of wordlines;

a second logic block contained in said global decoder configured to communicate with one of said groups of memory cells by said first communication path to enable one of a plurality of wordlines contained in said first and second pluralities of memory cell columns, wherein said wordline enables one of said rows of memory cells to either read or write a specific logic state; and a third logic block contained in said global decoder configured to enable one of said groups of memory cells and to disable every other of said groups of memory cells according to said address instruction.

16. The static random access memory of claim 15, wherein said first and second logic blocks obtain said address instruction from said address line coupled to said global decoder and operate according to a clock input coupled to said global decoder.

17. The static random access memory of claim 15, further comprising:

a computer to utilize said static random access memory for reading and writing specific logic states.

18. The static random access memory of claim 15, wherein said third logic block obtains said address instruction from an address line coupled to said global decoder and operates according to a clock input coupled to said global decoder.

19. The static random access memory of claim 15, further comprising:

a local buffer contained in each of said groups of memory cells to perform a final stage of decode; and a local group enable line contained in each of said groups of memory cells configured to transfer a signal received from said third logic block to said local buffer to activate said local buffer to perform said final stage of decode.

20. The static random access memory of claim 19, said local buffer comprising:

a first local group logic block to enable one of said plurality of column of memory cells when activated by said local group enable line; and a second local group logic block to enable one of said plurality of rows of memory cells, said second local group logic block activated by said local group enable line wherein data is either written to or read from a memory cell that is contained in said column and said row of memory cells.

21. The static random access memory of claim 20, further comprising:

a second communication path coupled to said second logic block; and a third local group logic block coupled to said second communication path, said third local group logic block coupled to said wordlines distally from the point that said first communication path is coupled to said wordlines so as to reduce delay caused by resistance or capacitance in said wordline, wherein said second communication path operates to enable one of said rows of memory cells to either read or write a specific logic state.

22. A method for configuring a static random access memory, comprising the steps of:

implementing a plurality of groups of memory cells, said groups of memory cells having first and second pluralities of memory cell columns, each of said columns including at least one memory cell wherein each memory cell is configured to read and write a respective logic state;

causing a voltage differential in said groups of memory cells to be detected wherein said logic state is recognized;

causing logic to multiplex access to said first and second pluralities of memory cells;

causing the selection of any individual row of said memory cells and any individual said memory cell column in any of said groups of memory cells by centrally decoding an address instruction, wherein said row contains at least one said memory cell;

enabling one of said columns of memory cells contained in one of said group of memory cells for reading or writing a specific logic state according to said centrally decoded address instruction;

enabling one of a plurality of wordlines contained in said first and second pluralities of memory cell columns according to said centrally decoded address instruction, wherein said wordline enables one of said rows of memory cells to either read or write a specific logic state; and enabling one of said groups of memory cells for reading or writing a logic state and disabling every other of said groups of memory cells from writing said logic state according to said centrally decoded address instruction.

23. The method of claim 22, further comprising the step of:

implementing said static random access memory for reading and writing specific logic states in a computer.

24. The method of claim 22, further comprising the steps of:

causing said centrally decoded address instruction to direct a local buffer one of said groups of memory cells to enable one of said plurality of columns of memory cells in that said group of memory cells; and causing said centrally decoded address instruction to direct said local buffer in one of said groups of memory cells to enable one of said plurality of rows of memory cells, wherein data is either written to or read from a memory cell that is contained in said column and said row of memory cells.

25. The method of claim 24, further comprising the steps of:

causing said centrally decoded address instruction to direct said local buffer in one of said groups of memory cells to enable one of said plurality of rows of memory cells at two or more points, wherein data is either written to or read from a memory cell that is contained in said column and said row of memory cells.

* * * * *